(12) United States Patent
Kikuchi et al.

(10) Patent No.: US 9,472,380 B2
(45) Date of Patent: Oct. 18, 2016

(54) SILICON PART FOR PLASMA ETCHING APPARATUS AND METHOD OF PRODUCING THE SAME

(71) Applicant: MITSUBISHI MATERIALS CORPORATION, Tokyo (JP)

(72) Inventors: Fumitake Kikuchi, Naka (JP); Yoshinobu Nakada, Ageo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/140,667

(22) Filed: Dec. 26, 2013

(65) Prior Publication Data

US 2014/0187409 A1 Jul. 3, 2014

(30) Foreign Application Priority Data

Dec. 27, 2012 (JP) ................. 2012-283984

(51) Int. Cl.
*H01J 37/32* (2006.01)
*C01B 33/02* (2006.01)

(52) U.S. Cl.
CPC ...... *H01J 37/32798* (2013.01); *H01J 37/3255* (2013.01); *H01J 37/32467* (2013.01); *H01J 37/32495* (2013.01); *C01B 33/02* (2013.01)

(58) Field of Classification Search
CPC .................................... C01B 33/02
USPC ....................................... 423/348
See application file for complete search history.

(56) References Cited

U.S. PATENT DOCUMENTS 5,038,013 A     8/1991   Akazawa et al.
2009/0315111 A1*  12/2009  Yamazaki et al. ............ 257/354

FOREIGN PATENT DOCUMENTS

| JP | 03-190126 A | 8/1991 |
| JP | 06-084851 A | 3/1994 |
| JP | 09-129605 A | 5/1997 |
| JP | 10-017393 A | 1/1998 |

OTHER PUBLICATIONS

Kurt Petersen, Silicon as a Mechanical Material, 1982, Proceedings of the IEEE, 70 No. 5, 420-457.*

* cited by examiner

*Primary Examiner* — Matthew E Hoban
*Assistant Examiner* — James Fiorito
(74) *Attorney, Agent, or Firm* — Locke Lord LLP; James E. Armstrong, IV; Nicholas J. DiCeglie, Jr.

(57) ABSTRACT

The present invention relates to a silicon part and a method of producing the silicon part. The silicon part is not worn quickly and particle formation is suppressed even if it is positioned in the reaction chamber of a plasma etching apparatus. The silicon part for the plasma etching apparatus is made of any one selected from a group consisting of poly-crystalline silicon, mono-like silicon, and single-crystalline silicon. Also, the silicon part includes boron as a dopant in a range from $1 \times 10^{18}$ atoms/cc or higher to $1 \times 10^{20}$ atoms/cc or lower.

3 Claims, 3 Drawing Sheets

SILICON PART FOR PLASMA ETCHING APPARATUS AND METHOD OF PRODUCING THE SAME

BACKGROUND OF THE INVENTION

1. Field of the Invention

The present invention relates to a silicon part, which is used for a plasma etching apparatus and used in a reaction chamber of the plasma etching apparatus. The present invention is also relates to a method of producing the silicon part for the plasma etching apparatus.

Priority is claimed on Japanese Patent Application No. 2012-283984, filed Dec. 27, 2012, the content of which is incorporated herein by reference.

2. Description of Related Art

Conventionally, the plasma etching apparatuses disclosed in JP-H03-190126(A) and JP-H06-084851(A) are widely used as an apparatus for etching treatment of the wafer's surface in the fabrication process of semiconductor devices.

An example of conventional plasma etching apparatus is shown in FIG. 5. The conventional plasma etching apparatus 50 includes: the reaction chamber 51, the inside of which is vacuum atmosphere; the electrode plate 52 provided in the reaction chamber 51; the mount table 53 provided to face the electrode plate 52 with an interspace; and the high frequency power supply 54 that applies an high frequency voltage between the electrode plate 52 and the mount table 53.

The method of the plasma etching treatment with the above-mentioned plasma etching apparatus 50 is explained below, The wafer 1 is placed on the mount table 53. Then, a high frequency voltage is applied between the electrode plate 52 and the mount table 53 by the high frequency power supply 54 while the etching gas 5 is flowed toward the wafer 1 though the fine through-hole 52a formed in the electrode plate 52. The plasma 7 is generated in the space between the electrode plate 52 and the mount table 53 by the above-described operation. Consequently, the surface of the wafer 1 is etched by the physical reaction by the plasma 7 and the chemical reaction by the etching gas 5.

For the above-mentioned electrode plate, silicon electrode plates made of single-crystalline or poly crystalline silicon are used as shown in JP-H09-129605 (A) and JP-H10-017393 (A), for example. In the above-mentioned plasma etching apparatus, it is possible that the surface of the electrode plate is worn by the plasma and the etching gas, and wafers are contaminated by the particles formed by the plasma and the etching gas. Therefore, in order to suppress the particle formation, cracks and defects on the surface of the silicon electrode are used to be eliminated by etching treatment or heat treatment. In addition, suppressing crack formation or the like by using the single crystalline silicon, the crystal plane of which is (100), is described in JP-H10-017393 (A).

SUMMARY OF THE INVENTION

Problems to be Solved by the Invention

In the above-mentioned plasma etching apparatus, in addition to the electrode plate part, many parts are provided in the reaction chamber. Thus, these parts are also etched by the plasma and the etching gas to be a source of the particles. It also causes shortened lifetime of the parts.

In the silicon electrode or the above-mentioned parts, cracking, defect formation, and particle formation can be reduced by using the single crystalline silicon free of grain boundaries. However, oxygen concentration in such single crystalline silicon is high since it is normally produced with a quartz crucible. Thus, the single crystalline silicon is etched at a fast rate to be worn quickly.

The present invention is made under the circumstance described above. The purpose of the present invention is to provide a silicon part for a plasma etching apparatus and a method of producing the silicon part. The silicon part s not worn quickly even if it is positioned in the reaction chamber of the plasma etching apparatus. Also, it allows suppressing the particle formation.

Means for Solving the Problem

The first aspect of the present invention is a silicon part, which is used for a plasma etching apparatus and used in a reaction chamber of the plasma etching apparatus, wherein the silicon part is made of any one selected from a group consisting of poly-crystalline silicon, mono-like silicon, and single-crystalline silicon, and the silicon part includes boron as a dopant in a range from $1 \times 10^{18}$ atoms/cc or higher to $1 \times 10^{20}$ atoms/cc or lower.

In the silicon part for the plasma etching apparatus configured as the first aspect of the present invention, in a case where the silicon part is made of ply-crystalline silicon or mono-like silicon, the oxygen concentration in the silicon part can be suppressed at a low level by coating the surface of the crucible with silicon nitride or the like during silicon production. In a case where the silicon part is made of single-crystalline silicon, the oxygen concentration can be suppressed at a low level by coating the inside surface of the crucible with Ba. The etching rate of the silicon part is lowered since the silicon part includes boron as a dopant in a range from $1 \times 10^{18}$ atoms/cc or higher to $1 \times 10^{20}$ atoms/cc or lower. Thus, fast wearing of the silicon part can be suppressed even if it is positioned in the reaction chamber of the plasma etching apparatus. Also, wafer etching can be performed in a desirable manner since particle formation being suppressed.

In a case where the boron content as a dopant is less than $1 \times 10^{18}$ atoms/cc, it is possible that the etching rate would not be reduced enough. On the other hand, in a case where the boron content excesses $1 \times 10^{21}$ atoms/cc, boron not being dissolved in solid phase is precipitated, possibly causing uneven etching. Therefore, the boron content as a dopant is set in a range from $1 \times 10^{18}$ atoms/cc or higher to $1 \times 10^{20}$ atoms/cc or lower. A preferable boron content is in a range from $1 \times 10^{19}$ atoms/cc or higher to $1 \times 10^{20}$ atoms/cc or lower.

In the first aspect of the present invention, an oxygen concentration in the silicon part may be $5 \times 10^{17}$ atoms/cc or lower.

By lowering the oxygen concentration in the silicon part to $5 \times 10^{17}$ atoms/cc or lower, the etching rate can be reliably reduced. Thus, the fast wearing by plasma etching can be suppressed.

In the first aspect of the present invention, a nitrogen concentration in the silicon part may be in a range from $7 \times 10^{14}$ atoms/cc or higher to $4 \times 10^{15}$ atoms/cc or lower.

By setting the nitrogen concentration in the range from $7 \times 10^{14}$ atoms/cc or higher to $4 \times 10^{15}$ atoms/cc or lower, or more preferably in a range from $1 \times 10^{15}$ atoms/cc or higher to $3 \times 10^{15}$ atoms/cc or lower, the etching rate can be reduced sufficiently. Thus, the fast wearing by plasma etching can be suppressed.

In a case where the nitrogen concentration is less than $7 \times 10^{14}$ atoms/cc, it is possible that the etching rate would not be reduced enough. On the other hand, in a case where the nitrogen concentration exceeds $4\times10^{15}$ atoms/cc, nitrogen is precipitated as silicon nitride, possibly causing particle formation, or uneven etching. Therefore, the nitrogen concentration is set in the range from $7\times10^{14}$ atoms/cc higher to $4\times10^{15}$ atoms/cc or lower.

In the first aspect of the present invention, a percentage of crystal orientation distribution in a (111) area may be 70% or more, the percentage of crystal orientation distribution in a (111) area being obtained by measuring crystal orientation on a surface of the silicon part by an EBSD method to obtain crystal orientation distribution in a stereographic triangle whose vertexes correspond to crystal surfaces (001), (101), and (111), splitting the stereographic triangle into a (001) area, (101) area, and the (111) area with lines connecting midpoints of each side and a centroid of the stereographic triangle, and dividing a number of measured points in each area by a total number of measured points to obtain percentages of crystal orientation in each area.

In this case, the etching rate can be reduced further because the silicon part is constituted of poly-crystalline silicon in which crystals in the silicon part are heavily oriented toward the [111] orientation. In this case, it is less likely a cleavage is formed even though crystals of the silicon part are oriented toward the [111] orientation, since the silicon part is made of poly-crystalline silicon. Thus, the silicon part can be handled with ease.

The second aspect of the present invention is a method of producing a silicon part for a plasma etching apparatus, which is the silicon part according to the first aspect of the present invention, the method comprising the steps of: forming a silicon melt, the silicon melt including boron in a range from $1\times10^{18}$ atoms/cc (atoms/cm$^3$, atoms/ml) or higher to $1\times10^{20}$ atoms/cc or lower; and solidifying the silicon melt unidirectionally, wherein a solidification rate in the step of solidifying is in a range from 5 mm/h or higher to 10 mm/h or lower.

By using the silicon part producing method configured as in the second aspect of the present invention, the above-explained first aspect of the present invention, which is the silicon part for a plasma etching apparatus, can be produced.

Effects of the Invention

According to the present invention configured as in the above-described first and second aspect of the present invention, a silicon part and a method of producing the silicon part are provided. The silicon part is not worn quickly and particle formation is suppressed even if it is positioned in the reaction chamber of a plasma etching apparatus.

DETAILED DESCRIPTION OF THE INVENTION

Embodiments of the Invention

The silicon part for a plasma etching apparatus, which is an embodiment of the present invention (hereinafter, referred as the silicon part of the present invention), is explained below.

The silicon part for a plasma etching apparatus of the present invention is consisted of poly-crystalline silicon. More specifically, it is consisted of a columnar crystal produced by the unidirectional solidification method.

The columnar crystal silicon is produced by casting. In this production process, the columnar crystal silicon is manufactured by the method allowing eliminating the internal stress, in contrast to the conventional poly-crystalline silicon production method. Therefore, the internal stress subjected to boundaries of crystal grains (hereinafter referred as a grain boundary) is relaxed in the columnar crystal silicon produced by the unidirectional solidification method. Thus, it has a superior workability compared to the conventional poly-crystalline silicon. Furthermore, highly-pure products can be obtained since it crystallizes excluding impurities from crystals during the unidirectional solidification.

The silicon part for a plasma etching apparatus, which is the present embodiment includes boron as a dopant in a range from $1\times10^{18}$ atoms/cc or higher to $1\times10^{20}$ atoms/cc or lower. Also, the oxygen concentration in the silicon part is suppressed to $5\times10^{17}$ atoms/cc or lower, and the nitrogen concentration is suppressed in a range from $7\times10^{14}$ atoms/cc or higher to $4\times10^{15}$ atoms/cc or lower.

Further, the silicon part of the present embodiment is constituted of poly-crystalline silicon whose crystals are heavily oriented toward the [111] orientation. More specifically, a percentage of crystal orientation distribution in a (111) area is 70% or more. The percentage of crystal orientation distribution in a (111) area can be obtained by measuring crystal orientation on a surface of the silicon part by an EBSD method. The crystal orientation distribution in a stereographic triangle whose vertexes correspond to crystal surfaces (001), (101), and (111) can be obtained by splitting the stereographic triangle into a (001) area A, (101) area B, and the (111) area C with lines connecting midpoints of each side and a centroid of the stereographic triangle, and dividing a number of measured points in each area by a total number of measured points to obtain percentages of crystal orientation in each area.

Figure 1:
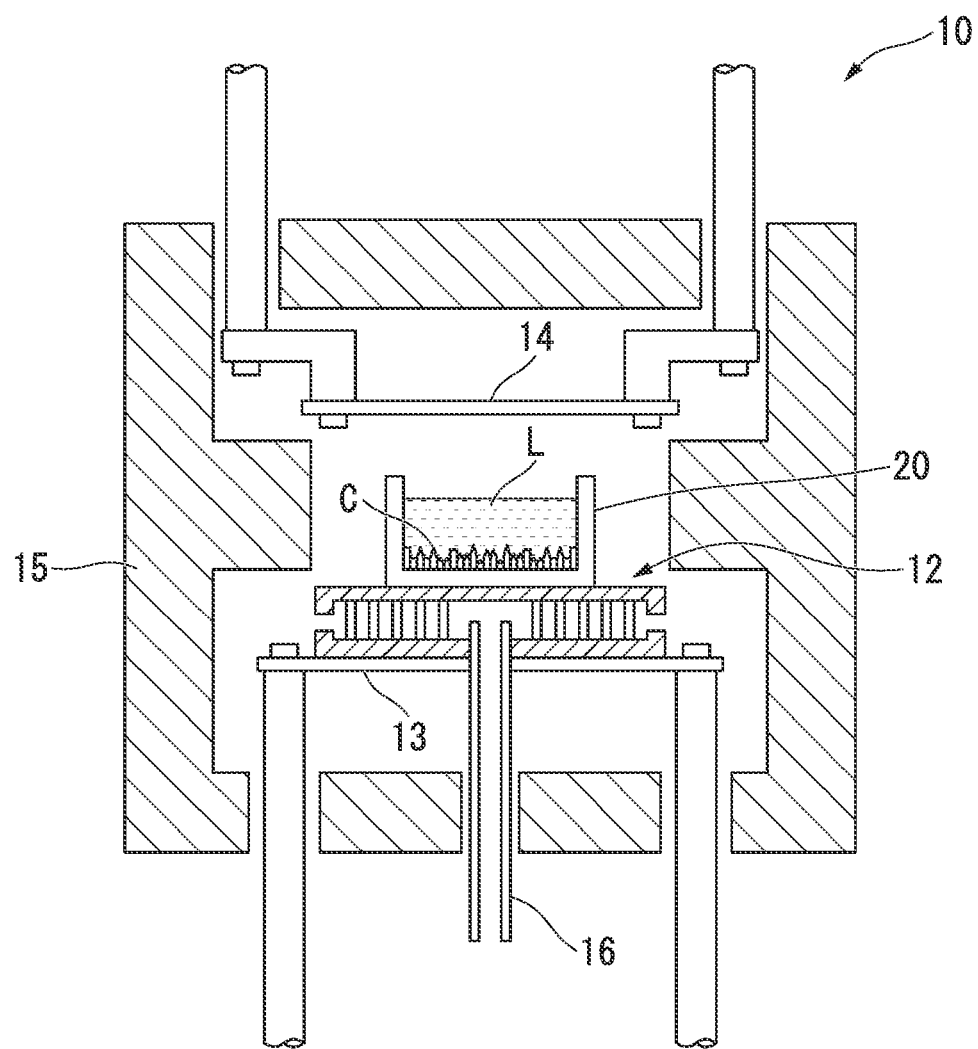
FIG. 1 is a schematic illustration of a production apparatus of producing a poly-crystalline silicon ingot or a mono-like silicon ingot.

Next, the poly-crystalline silicon ingot producing apparatus 10, which is used for producing the poly-crystalline silicon ingot, is explained in reference to FIG. 1. The poly-crystalline ingot is used as the source material of the silicon part of the present embodiment.

The poly-crystalline silicon ingot producing apparatus 10 include: the crucible 20 holding the silicon melt L; the chill plate 12 on which the crucible 20 is placed; the bottom heater 13 supporting the chill plate 12 from below; and the ceiling heater 14 provided above the crucible 20. Also, the heat insulator 15 is provided around the crucible 20.

The chill plate 12 is in a hollow structure, and Ar gas is supplied into the internal space through the supply pipe 16.

The crucible 20 is in a polygonal shape (rectangle) or a round shape (circle) in the horizontal cross-section. In the present embodiment, it is in a rectangular shape.

The crucible 20 is made of quartz (SiO$_2$), and its internal surface is coated with silicon nitride (Si$_3$N$_4$). In other words, the crucible 20 is configured in such a way that the silicon melt L in the crucible 20 does not contact with quartz ($SiO_2$) directly.

Next, the method of poly-crystalline silicon using the poly-crystalline silicon ingot producing apparatus 10 is explained below.

First, silicon material is inserted in the crucible 20. As the silicon material, clamps, which are called "chunks" and obtained by crushing the highly pure silicon in 11N grade (purity: 99.999999999%), are used. The size of the clamps is 30 mm to 100 mm, for example.

In order to dope the ingot with boron, a silicon wafer highly doped with boron in advance or boron in the metal form is used as the source material. After weighting appropriate amount, it is introduced into the crucible 20 holding the silicon material. The doping amount of boron is adjusted in such a way that the boron content in the silicon crystal is in the range from $1 \times 10^{18}$ atoms/cc or higher to $1 \times 10^{20}$ atoms/cc or lower.

Then, the silicon material is heated by applying electricity to the ceiling heater 14 and the bottom heater 13. Because the silicon material is melted by heat, the silicon melt L is held in the crucible 20. A preferable condition after melting the silicon material is holding it at 1500° C. for 2 hours.

Next, application of electricity to the bottom heater 13 is stopped, and Ar gas is supplied to the internal space of the chill plate 12 through the supply pipe 16. Because of this, the bottom part of the crucible 20 is cooled. Then, application of electricity to the ceiling heater 14 is gradually reduced. In this way, the silicon melt L in the crucible 20 is cooled from the bottom part of the crucible 20. This allows growth of columnar crystals from the bottom part upward, the silicon melt L is unidirectionally solidified. A preferred casting condition is adjusting the solidification rate in the range from 5 mm/h or higher to 10 mm/h or lower.

Preferred crystal growth orientation is the [001] and [111] orientations. Thus, a larger amount of columnar crystals facing in the orientations are obtained normally. However, the casting condition is controlled in order to stimulate crystal growth in the [111] orientation in the present embodiment. Specifically, it is preferred to set the solidification rate in the range from 5 mm/h or higher to 10 mm/h or lower. As a measure to control the crystal orientation, a seed crystal (single-crystalline silicon), a dendrite growth, or the like can be used.

The poly-crystalline silicon ingot can be manufactured by the unidirectional solidification method as explained above.

The obtained poly-crystalline silicon ingot is then machined, and the surface of the machined ingot is grinded and polished to obtain flatness greater than mirror polishing. In this way, the silicon part, which is for a plasma etching apparatus and used in the reaction chamber of the plasma etching apparatus, is produced. As examples of the silicon part for the plasma etching apparatus, an electrode plate, varieties of rings, such as a protection ring, a seal ring, and an earth ring, or the like can be named.

According to the silicon part for the plasma etching apparatus configured as described above as the present embodiment, the etching rate is reduced since it includes boron as a dopant in a range from $1 \times 10^{18}$ atoms/cc or higher to $1 \times 10^{20}$ atoms/cc or lower. Also, fast wearing of the silicon part is suppressed even if it is positioned in the reaction chamber of the plasma etching apparatus, and particle formation is suppressed. Further, precipitation of excessive boron, which was not dissolved in the solid phase, is prevented.

Furthermore, the etching rate can be reliably reduced since the oxygen concentration in the silicon part is set to $5 \times 10^{17}$ atoms/cc or lower. This also allows reducing the fast wearing of the silicon part due to plasma etching. In this embodiment, the poly-crystalline silicon ingot is casted by using the crucible 20, which is constituted of quartz ($SiO_2$) and coated with silicon nitride ($Si_3N_4$) on its inner surface, to prevent the silicon melt L from contacting to quartz ($SiO_2$) directly. Thus, the oxygen concentration in the silicon part can be reduced to $5 \times 10^{17}$ atoms/cc or lower. Further, by setting the solidification rate low, such as 10 mm/h or lower, oxygen release from the silicon melt L as SiO gas can be stimulated, allowing reduction of oxygen concentration in the silicon part. By blowing an inert gas to the upper part of the crucible 20, the SiO release can be further stimulated. Also, by setting the temperature of the silicon melt L to 1430° C. or less, the concentration of oxygen dissolved in the silicon melt L can be reduced.

Further, the etching rate can be reduced and the fast wearing due to plasma etching can be suppressed, since the nitrogen concentration is set in a range from $7 \times 10^{14}$ atoms/cc or higher to $4 \times 10^{15}$ atoms/cc or lower. Also, precipitation of excessive nitrogen as silicon nitride can be suppressed. In this embodiment, the crucible 20, which is constituted of quartz ($SiO_2$) and coated with silicon nitride ($Si_3N_4$) on its inner surface, is used. Thus, the nitrogen concentration can be set in a range from $7 \times 10^{14}$ atoms/cc or higher to $4 \times 10^{15}$ atoms/cc or lower. Since nitrogen is mixed in the silicon melt L from the above-mentioned coating, the nitrogen concentration can be reduce by setting the solidification rate high, such as 5 mm/h or higher. The segregation coefficient of nitrogen is extremely low. Thus, it is preferable to stimulate convection in the silicon melt L to keep the nitrogen concentration in the silicon melt L in a uniform value. Also, by setting the temperature of the silicon melt L to 1430° C. or less, the concentration of nitrogen dissolved in the silicon melt L can be reduced.

Figure 2:
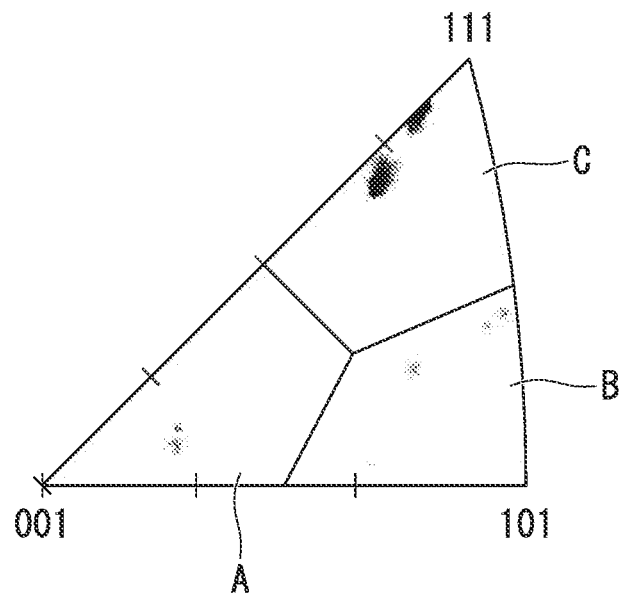
FIG. 2 is a diagram, in which results of the crystal orientation measurement of Example 1 of the present invention by EBSD method is presented in a stereographic triangle.

Further, as shown in FIG. 2, a percentage of crystal orientation distribution in a (111) area is set to 70% or more, the percentage of crystal orientation distribution in a (111) area being obtained by measuring crystal orientation on a surface of the silicon part by an EBSD method to obtain crystal orientation distribution in a stereographic triangle whose vertexes correspond to crystal surfaces (001), (101), and (111), splitting the stereographic triangle into a (001) area A, (101) area B, and the (111) area C with lines connecting midpoints of each side and a centroid of the stereographic triangle, and dividing a number of measured points in each area by a total number of measured points to obtain percentages of crystal orientation in each area. Thus, the etching rate can be further reduced.

Further, the poly-crystalline silicon ingot manufactured by the unidirectional solidification method is used in the present embodiment as explained above. Thus, the amount of impurities such as metal elements except for silicon can be reduced, allowing suppressing uneven etching. Thus, local wearing at a part of the silicon part can be suppressed, allowing having longer service life of the silicon part.

While the silicon part for a plasma etching apparatus is explained above as a preferred embodiment of the present invention, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

For example, it was explained that the poly-crystalline silicon ingot, which is manufactured with the poly-crystalline silicon ingot producing apparatus show FIG. 1, is used as the source material of the silicon part. However, the present invention is not particularly limited by the configuration, and other source materials, such as poly-crystalline silicon, mono-like silicon, or single-crystalline silicon manufactured by a production apparatus configured differently from one shown in FIG. 1, can be used.

The mono-like silicon can be manufactured by aligning (111) face seed crystals (single-crystalline silicon) of 20 mm thickness for example on the bottom of the quartz crucible coated with silicon nitride. Then, poly silicon material is place on them and boron is added to obtain a predetermined concentration afterward. Then, unidirectional solidification is performed while the temperatures of the upper and lower heaters are controlled not to melt the seed crystals completely.

The single-crystalline silicon can be manufactured by inserting poly silicon material in a quartz crucible coated by barium (Ba). Then, a silicon wafer coated with silicon nitride and a wafer highly doped with boron or boron in a metal form are inserted into the crucible, in order to obtain predetermined concentrations of nitrogen and boron. Then, the single-crystalline silicon ingot is pulled from the crucible using the (111) seed crystal to obtain the (111) face orientation single-crystalline silicon. In order to reduce the oxygen concentration in the single-crystalline silicon, the pulling can be performed at a higher vacuum condition.

EXAMPLES

Results of experiments performed to confirm effects of the present invention are explained below. A poly-crystalline silicon ingot in a square columnar shape (side×height: 680 mm×300 min) was manufactured with the silicon ingot producing apparatus explained in the embodiment. Boron content as a dopant, the oxygen concentration, and nitrogen concentration were adjusted to obtain the poly-crystalline ingots having compositions shown in Table 1. Further, the percentage of crystal orientation distribution in the (111) area C was adjusted to 70% or more by controlling the solidification rate. Square plates having a dimension of 100 mm of side and 1 mm of thickness were cut out from the ingots, and test pieces were prepared by mirror-polishing the major surfaces of the plates. The boron content, the oxygen concentration, and the nitrogen concentration were measured using SIMS.

Plasma etching treatment was performed on the test pieces prepared as described above with the plasma etching apparatus (Model: YR-4011 1H-DXII, manufactured by Youtec Co. Ltd.). Then, height difference between the etched part and the masked part was measured with the surface roughness meter (Model: Dectak, manufactured by Bruker AXS Co. Ltd.) and the etching rate was calculated. The etching condition was: vacuum was 50 mTorr; etching time was 30 min; etching gas was SF6; flow rate of etching gas was 10 sccm; and power was 100 W. The evaluation results are indicated in Table 1.

TABLE 1

| | Material | Boron content atoms/cc | Oxygen concentration atoms/cc | Nitrogen concentration atoms/cc | Etching rate μm/h |
|---|---|---|---|---|---|
| Example 1 | Poly-crystalline | $2.7 \times 10^{19}$ | $3.0 \times 10^{17}$ | $2.6 \times 10^{15}$ | 28.5 |
| Example 2 | Poly-crystalline | $2.6 \times 10^{19}$ | $7.0 \times 10^{16}$ | $2.9 \times 10^{15}$ | 27.9 |
| Example 3 | Poly-crystalline | $4.8 \times 10^{18}$ | $4.0 \times 10^{17}$ | $1.3 \times 10^{15}$ | 31.4 |
| Example 4 | Poly-crystalline | $3.3 \times 10^{19}$ | $7.0 \times 10^{17}$ | $6.9 \times 10^{14}$ | 31.5 |
| Example 5 | Poly-crystalline | $3.0 \times 10^{18}$ | $8.1 \times 10^{17}$ | $5.8 \times 10^{14}$ | 32.9 |
| Example 6 | Poly-crystalline | $2.5 \times 10^{19}$ | $1.0 \times 10^{17}$ | $7.5 \times 10^{14}$ | 30.2 |
| Example 7 | Poly-crystalline | $5.3 \times 10^{19}$ | $1.1 \times 10^{16}$ | $5.3 \times 10^{14}$ | 30.1 |
| Comparative Example 1 | Poly-crystalline | $1.2 \times 10^{15}$ | $6.8 \times 10^{17}$ | $6.3 \times 10^{14}$ | 36.0 |
| Comparative Example 2 | Poly-crystalline | $4.8 \times 10^{17}$ | $6.5 \times 10^{17}$ | $5.8 \times 10^{14}$ | 34.6 |

In Comparative Examples 1 and 2, in which the boron contents were lower than the range in the present invention, the etching rates were higher, meaning etching proceeded faster.

Contrary to that, in Examples 1 to 7 of the present invention, in which the boron contents were in the range of the present invention, the etching rates were low, confirming fast wearing was suppressed. Particularly, in Examples 1 and 2, in which the oxygen concentration was $5 \times 10^{17}$ atoms/cc or lower, the nitrogen concentration was in the range from $7 \times 10^{14}$ atoms/cc or higher to $4 \times 10^{15}$ atoms/cc or lower, and the boron content was in the range from $1 \times 10^{19}$ atoms/cc or higher to $1 \times 10^{20}$ atoms/cc or lower, it was confirmed that the etching rates were particularly low.

Also, a result measuring crystal orientation in Example 1 by ESBD method is indicated in FIG. 2. A result measuring crystal orientation in Comparative Example 1 is indicated in FIG. 3.

In EBSD method, electron beam is radiated into a point on the test piece surface in SEM, and crystal orientation or structure at a local spot is analyzed using the generated reflection electron diffraction patterns. EBSD image can be obtained from the diffraction pattern obtained by irradiating electron beam into a point on the test piece surface. By scanning the test piece surface with a constant interval, and repeating the scanning, Kikuchi lines can be obtained. By analyzing the obtained Kikuchi lines, crystal orientation and structure are mapped on the test piece surface. Samples in a plate shape having a dimension of 5 mm side and 2 mm thickness were prepared. The measurement surfaces of the samples were mirror-polished, and the entire measurement surfaces of the samples were subjected to the measurement.

Figure 3:
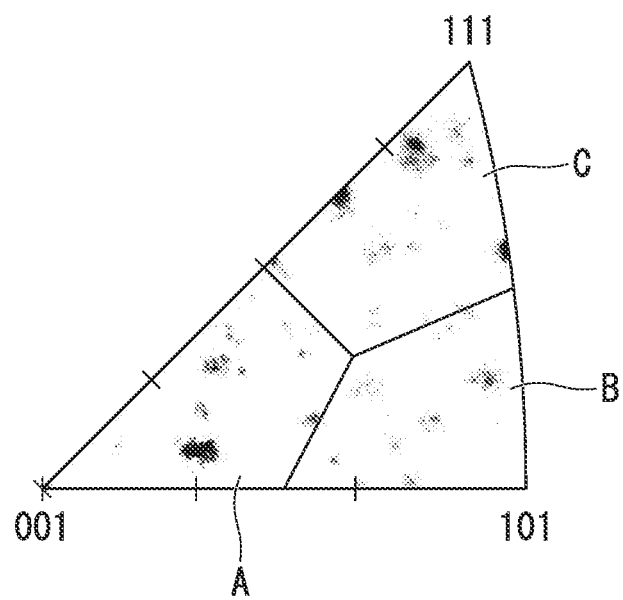
FIG. 3 is a diagram, in which results of the crystal orientation measurement of Comparative Example 1 by EBSD method is presented in a stereographic triangle.

In FIGS. 2 and 3, each small black dot corresponds to a measured spot. Thus, by dividing the number of dots in the (111) area C by the total number of measured spots, the percentage of crystal orientation distribution in a (111) area C can be calculated. In Example 1 of the present invention, the percentage was about 80%. In Comparative Example 1, the percentage was about 30%.

Figure 4:
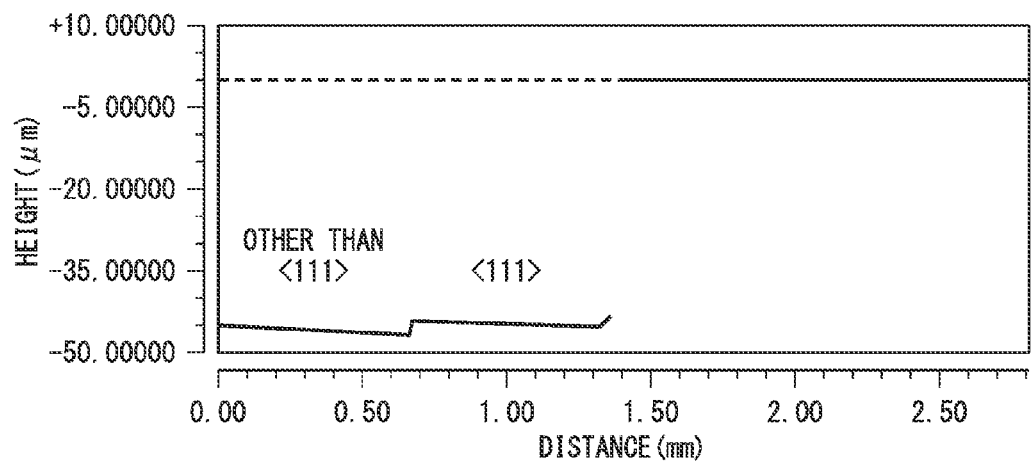
FIG. 4 is a graph showing etching rate difference depending on crystal orientations.
Figure 5:
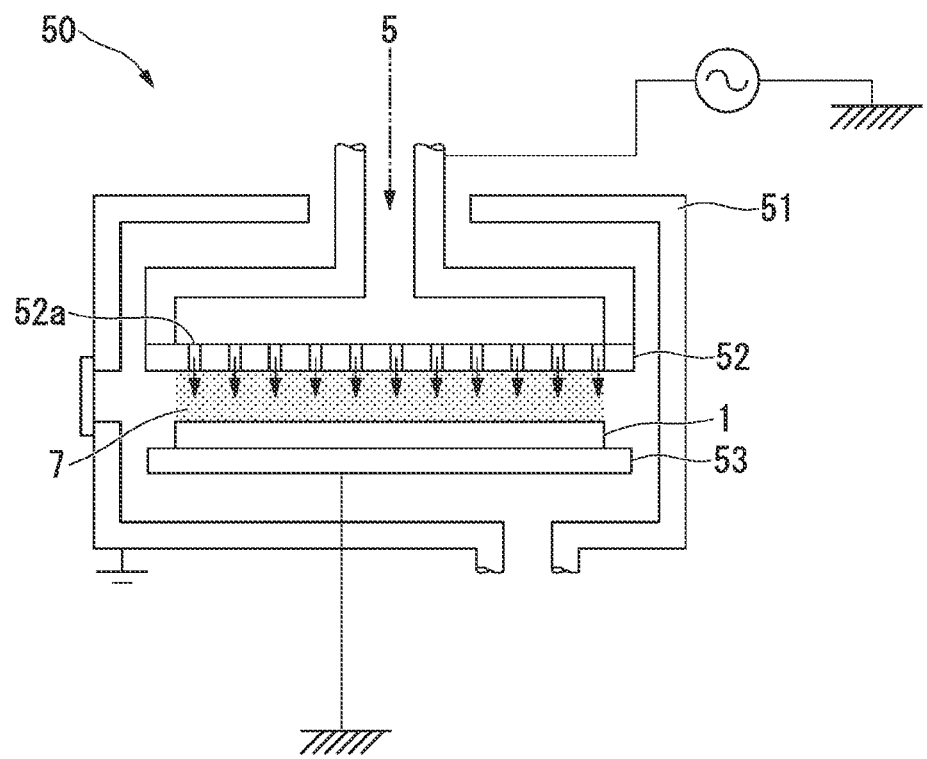
FIG. 5 is a schematic illustration of a plasma etching apparatus.

A result comparing the etching amounts on the [111] orientation crystal and the crystal whose orientation is other than the [111] orientation is shown in FIG. 4. After measuring the orientation, plasma etching was performed. The heights of the surfaces of the test piece were measured with the surface roughness meter (Model: Dectak, manufactured by Bruker AXS Co. Ltd.).

It was confirmed that the height of the surface corresponding to the [111] orientation part was higher than that corresponding to other. The result confirms that the etching rate was lower in the [111] orientation crystal.

BRIEF DESCRIPTION OF THE REFERENCE SYMBOLS

50: Plasma etching apparatus
51: Reaction chamber
52: Electrode plate

What is claimed is:

1. A silicon part, which is used for a plasma etching apparatus and used in a reaction chamber of the plasma etching apparatus, wherein
   the silicon part is made of any one selected from the group consisting of poly-crystalline silicon and mono-like silicon,
   the silicon part includes boron as a dopant in a range from $1\times10^{18}$ atoms/cc or higher to $1\times10^{20}$ atoms/cc or lower, and
   a nitrogen concentration in the silicon part is in a range from $7\times10^{14}$ atoms/cc or higher to $4\times10^{15}$ atoms/cc or lower wherein a percentage of crystal orientation distribution in a (111) area is 70% or more, the percentage of crystal orientation distribution in a (111) area being obtained by measuring crystal orientation on a surface of the silicon part by an EBSD method to obtain crystal orientation distribution in a stereographic triangle whose vertexes correspond to crystal surfaces (001), (101), and (111), splitting the stereographic triangle into a (001) area, (101) area, and the (111) area with lines connecting midpoints of each side and a centroid of the stereographic triangle, and dividing a number of measured points in each area by a total number of measured points to obtain percentages of crystal orientation in each area.

2. The silicon part for a plasma etching apparatus according to claim 1, wherein an oxygen concentration in the silicon part is $5\times10^{17}$ atoms/cc or lower.

3. A method of producing a silicon part for a plasma etching apparatus, which is the silicon part according to claim 1, the method comprising the steps of:
   forming a silicon melt, the silicon melt including boron in a range from $1\times10^{8}$ atoms/cc or higher to $1\times10^{28}$ atoms/cc or lower; and
   solidifying the silicon melt unidirectionally, wherein a solidification rate in the step of solidifying is in a range from 5 mm/h or higher to 10 mm/h or lower.

* * * * *